United States Patent
Yu

(10) Patent No.: US 8,455,294 B2
(45) Date of Patent: Jun. 4, 2013

(54) METHOD OF FABRICATING AN IMAGE SENSOR STRUCTURE

(71) Applicant: United Microelectronics Corp., Hsin-Chu (TW)

(72) Inventor: Cheng-Hung Yu, Taoyuan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/653,417

(22) Filed: Oct. 17, 2012

(65) Prior Publication Data

US 2013/0040416 A1 Feb. 14, 2013

Related U.S. Application Data

(62) Division of application No. 12/553,987, filed on Sep. 4, 2009, now Pat. No. 8,314,469.

(51) Int. Cl.
*H01L 21/00* (2006.01)

(52) U.S. Cl.
USPC ............... 438/78; 438/73; 438/75; 438/80; 438/81; 257/466

(58) Field of Classification Search
USPC ............ 438/73, 75, 78, 80, 81; 257/466
See application file for complete search history.

(56) References Cited

U.S. PATENT DOCUMENTS

| | | | |
|---|---|---|---|
| 5,926,411 A * | 7/1999 | Russell | 365/106 |
| 6,417,022 B1 | 7/2002 | Hsiao et al. | |
| 6,590,239 B2 | 7/2003 | Hsiung et al. | |
| 6,970,293 B2 | 11/2005 | Natori | |
| 7,166,489 B2 | 1/2007 | Kim | |
| 7,262,073 B2 | 8/2007 | Baek et al. | |
| 2003/0020083 A1 | 1/2003 | Hsiung | |
| 2004/0142501 A1 | 7/2004 | Nakai | |
| 2005/0225807 A1 | 10/2005 | Fainstain et al. | |
| 2006/0027732 A1 | 2/2006 | Ahn | |
| 2006/0097133 A1 | 5/2006 | Yaung | |
| 2007/0020791 A1 | 1/2007 | Hsu et al. | |
| 2008/0191299 A1 | 8/2008 | Parks | |

FOREIGN PATENT DOCUMENTS

CN 1518118 A 8/2004

* cited by examiner

*Primary Examiner* — Thanh V Pham
(74) *Attorney, Agent, or Firm* — Winston Hsu; Scott Margo

(57) ABSTRACT

A method for making the image sensor structure, for avoiding or mitigating lens shading effect. The image sensor structure includes a substrate, a sensor array disposed at the surface of the substrate, a dielectric layer covering the sensor array, wherein the dielectric layer includes a top surface having a dishing structure, an under layer filled into the dishing structure and having a refraction index greater than that of the dielectric layer, a filter array disposed on the under layer corresponding to the sensor array, and a microlens array disposed above the filter array. A top layer may be additionally disposed to cover the filter array and the microlens array is disposed on the top layer.

18 Claims, 8 Drawing Sheets

METHOD OF FABRICATING AN IMAGE SENSOR STRUCTURE

CROSS REFERENCE TO RELATED APPLICATIONS

This application is a division of U.S. patent application Ser. No. 12/553,987, filed Sep. 4, 2009, which is incorporated herein by reference in its entirety.

BACKGROUND OF THE INVENTION

1. Field of the Invention

The present invention relates to an image sensor structure and a method of fabricating the same, and particularly to an image sensor structure and a method of fabricating the same capable of avoiding or mitigating shade effect.

2. Description of the Prior Art

For digital imaging apparatuses, such as digital still cameras or digital video cameras, image quality is one of the most significant design issues. In an image generated by an image sensor of a conventional digital imaging apparatus, the central portion of the image is typically brighter than the peripheral portion of the image. This phenomenon is also referred to as lens shading effect or vignetting phenomenon, which is caused by a non-uniform photo-response across the lens of the digital imaging apparatus. It is found that if the chief ray angle is greater than 20 degrees, the brightness of the peripheral image is 78% or less of the brightness of the central image. Hence, various lens shading compensation methods have been disclosed in order to mitigate the lens shading effect.

FIG. 1 illustrates a cross-sectional diagram of a conventional CMOS image sensor structure. In the CMOS image sensor structure 10, photodiodes 12 are formed in the surface of a substrate 14. A passivation layer 22 covers each of three metal conductor layers 16, 18, and 20. A dielectric layer 24 covers each passivation layer 22 and is planarized. An under layer 26, which is planar and with a substantially uniform thickness, is formed on the up most dielectric layer 24. Color filters 28, such as red filters 30, green filters 32, and blue filters 34 are formed on the under layer 26. A top layer 27 is formed on the color filters (CFs) 28. Microlenses 36 are formed on the top layer 27. With such structure, focal length can be sufficient for allowing light to focus on the photodiodes 12 within the substrate 14, and, accordingly, the shading effect on such structure is not obvious.

However, with the demand for lighter, thinner, shorter, and smaller devices, the focal length must be shortened. Thus, the chief-ray angle is increased and the shading effect becomes significant. FIG. 2 illustrates a combination of a conventional CMOS image sensor structure and a lens module. Photodiodes 12 are located within the surface 15 of the substrate 14. All of the photodiodes, dielectric layers, or protection layers are not shown for purpose of concise and easy reading. As shown in FIG. 2, in the situation that the focal length is too short, after the incident light 38 passes through the lens module 40, a light beam reaches the edge, passes through the microlens 42 or 43 at the edge, and passes through the top layer 27, the color filter (CF) 28, the under layer 26 and the dielectric layer 46 to focus on the point A or A'; and another light beam reaches the center, passes through the microlens 44 at the center, and passes through the top layer 27, the color filter 28, the under layer 26 and the dielectric layer 46 to focus on the point B. It can be found that the points B and A or A' are not on a same planar face. The B point is lower. The arc line 48 roughly depicts a line formed by all focus positions. In a plan view, the focus positions form a concave face having a depth difference d from the horizontal surface 15 of the substrate 14 where the photodiodes 12 are located, leading to non-uniform photo-response and making the peripheral image darker.

FIG. 3 illustrates a conventional way to mitigate shading effect by shifting the microlens inward and/or shifting the color filter outward, in order to make the focuses to be along with the positions of the photodiodes at the surface of the substrate to reduce the depth difference, that is, to make the depth d' (for point B') to become zero if possible. However, as shorter focal length is demanded, the chief-ray angle becomes greater, where the shifting of the microlenses or the color filters is spatially limited and can not well compensate the shading effect.

Therefore, there is still a need for a novel image sensor structure which is small, light, short, and thin, without suffering from shading effect.

SUMMARY OF THE INVENTION

One objective of the present invention is to provide an image sensor structure, in which shading effect can be avoided or mitigated, giving a uniform photo-response.

The image sensor structure according to the present invention includes a substrate; a sensor array disposed at the surface of the substrate; a dielectric layer covering the sensor array, wherein the dielectric layer comprises a top surface comprising a dishing structure; an under layer filled into the dishing structure and having a refraction index greater than that of the dielectric layer; a filter array disposed on the under layer corresponding to the sensor array; and a microlens array disposed on the filter array.

In another aspect of the present invention, the method of fabricating an image sensor structure according to the present invention comprises steps as follows. First, a substrate is provided. A sensor array is formed at the surface of the substrate. Thereafter, a dielectric layer is formed to cover the sensor array and the substrate. The top surface of the dielectric layer is formed into a dishing structure. Thereafter, an under layer is formed in the dishing structure, wherein the under layer has a refraction index greater than that of the dielectric layer. A filter array is formed on the under layer. A microlens array is formed on the filter array.

In the image sensor structure according to the present invention, an under layer is disposed beneath a filter array. The under layer is filled into the dishing-shaped top surface structure of the underlying dielectric layer. Material for the under layer is selected, such that the under layer can play as a role of a convex lens to compensate the focal length difference between the center and the edge of the sensor array, in addition to functions of adhesion and planarization. Hence, the photo-response in one chip will be more uniform.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
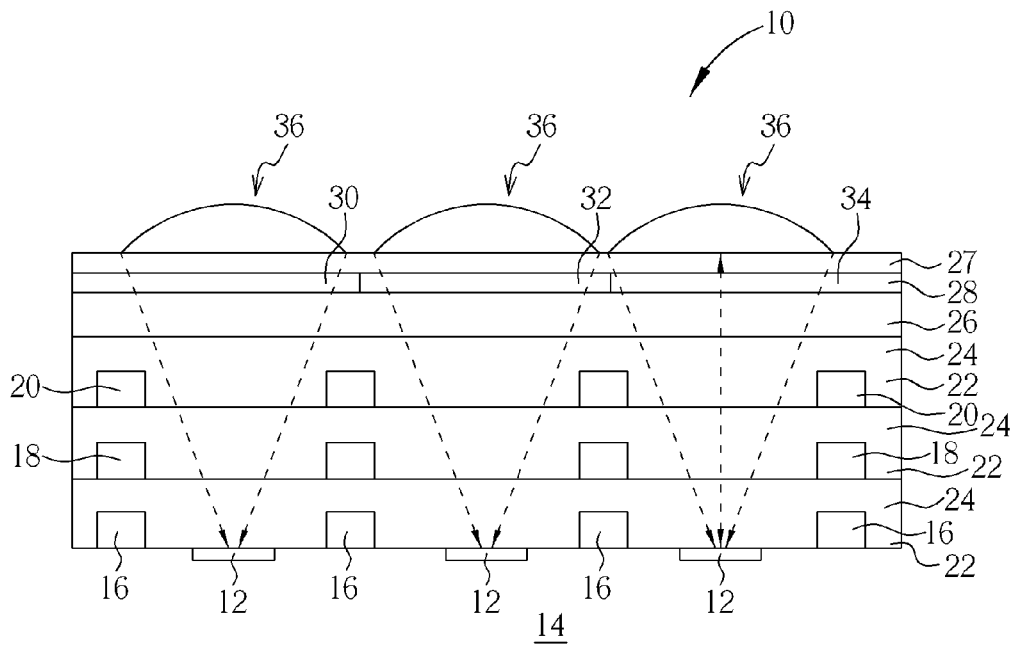
FIG. 1 illustrates a cross-sectional diagram of a conventional CMOS image sensor structure.
Figure 2:
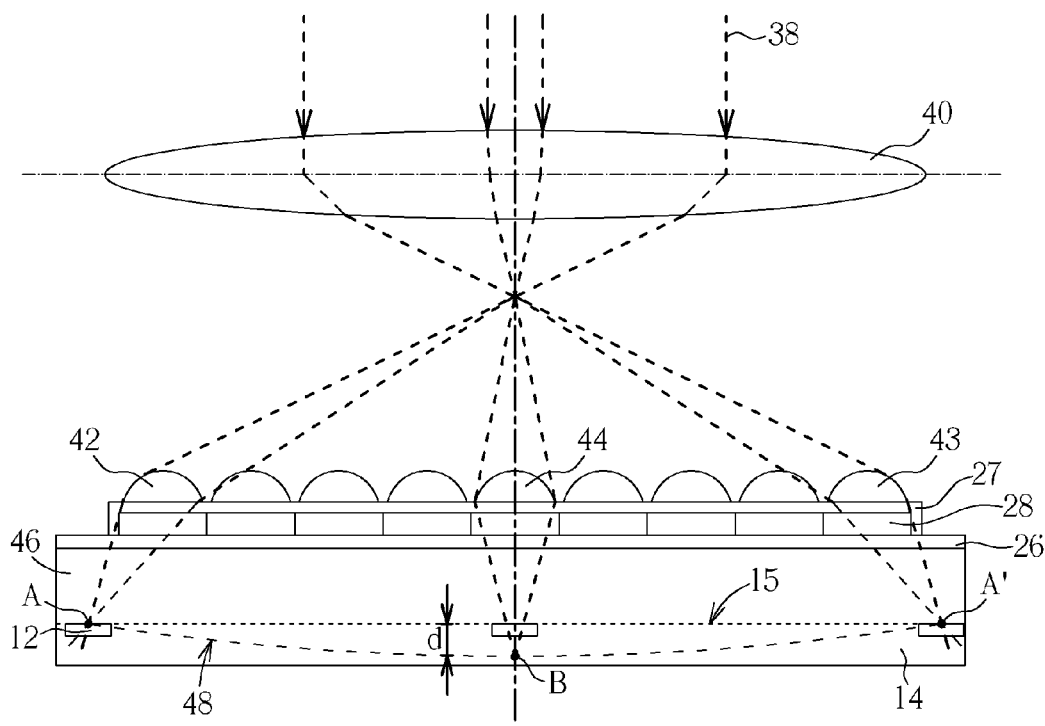
FIG. 2 illustrates a combination of a conventional CMOS image sensor structure and a lens module.
Figure 3:
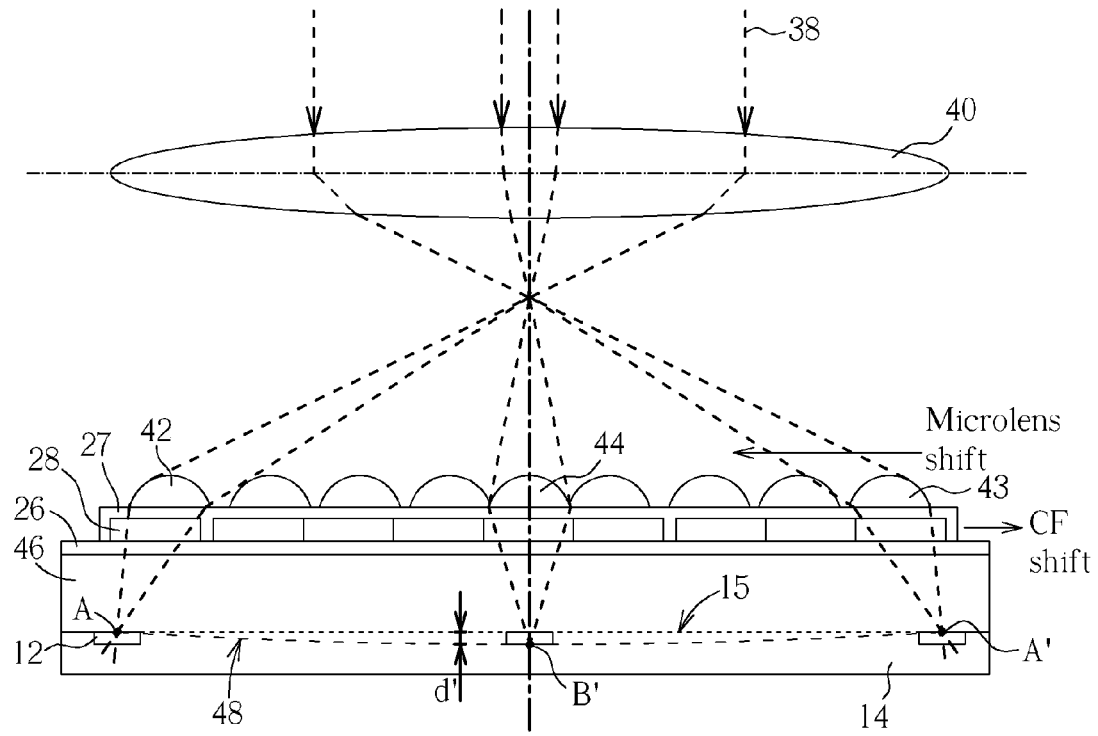
FIG. 3 illustrates a conventional way to mitigate shading effect.
Figure 4:
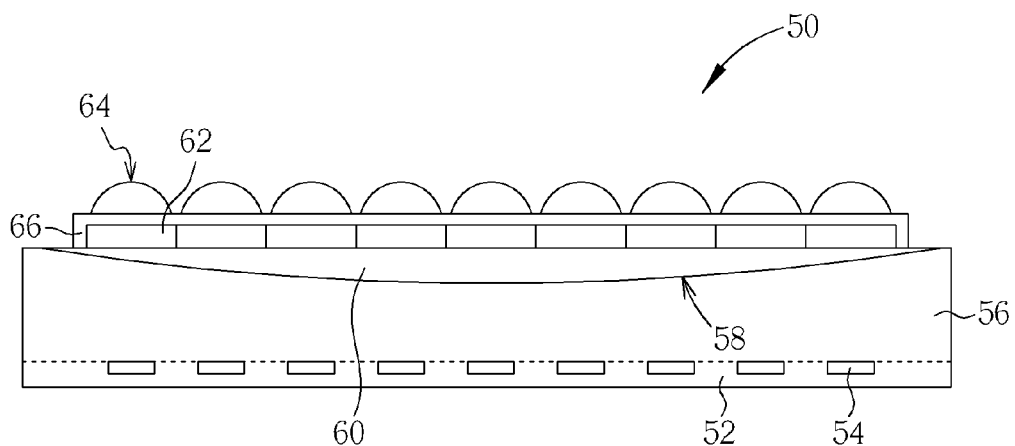
FIG. 4 illustrates a cross-sectional diagram of an embodiment of the image sensor structure according to the present invention.

The image sensor structure according to the present invention may be applied to CMOS image sensor (CIS) devices or charge coupled devices (CCD). FIG. 4 illustrates a cross-sectional diagram of an embodiment of the image sensor structure according to the present invention. As shown in FIG. 4, the image sensor structure 50 includes a substrate 52, a sensor array 54, a dielectric layer 56, an under layer 60, a filter array 62, and a microlens array 64. The substrate 52 may be for example a semiconductor substrate. The sensor array 54, i.e. an array of sensing elements, is disposed at the surface of the substrate 52. It maybe disposed in or on the substrate surface without particular limitation but in accordance with the properties of the sensing element or device design. The sensing element may be, for example, photo-sensing element, such as photodiode. The dielectric layer 56 covers the sensor array 54 and the substrate 52. The dielectric layer 56 includes a top surface 58 and is concave. Hence, the top surface 58 is in a shape of dish or shallow dish, forming a dishing structure. There may be a plurality of layers of metal interconnects disposed within the dielectric layer 56 for electric conduction or light shielding.

The dishing structure is filled with an under layer material to form an under layer 60. The under layer 60 has a refraction index which may be greater, and preferably slightly greater, than the refraction index of the dielectric layer 56 and may be less than the refraction index of the microlens. For example, the refraction index of the under layer 60 may be within a range from about 1.5 to about 1.6, but not limited thereto. It may depend on optical properties as a whole. The under layer may include a material of, in addition to the required refraction index, high transmittance and may also serve as a glue layer to combine the filters and the dielectric layer 56 together. Furthermore, the under layer may also have a planarization function for providing a planar surface for the filters to be formed on. Furthermore, the under layer material may be preferably suitable for a filling process, for convenient fabrication. It may be selected from conventional materials for color filter top layer or under layer, but not limited thereto. It maybe, for example, a polymer, such as acrylic polymer, but not limited thereto. The filter array 62 is disposed on the under layer 60 at a location corresponding to the sensor array 54. The filter array 62 is an array of a plurality of filters. The filters may be for example color filters or non-color filters, depending on the desire for the products. The microlens array 64 is correspondingly disposed above the filter array 62.

The depth of the dishing structure may depend on optical properties or as desired. The under layer has properties similar to a convex lens, and accordingly the depth of the dishing structure may be properly decided according to the size of the sensing region of the image sensor structure, optical design, or optical properties of the under layer, microlens, filters, and the like. Integrally, with respect to a digital imaging device, the depth of the dishing structure and focus number are allowed to be coordinated each other such that the light beams can focus along the planar face of the sensor array to reduce the difference of photo-response from sensing elements.

Furthermore, the image sensor structure according to the present invention may further comprise a shielding layer for shielding light. The shielding layer is disposed in the dielectric layer to surround the dishing structure. The shielding layer may comprise a metal material, such as Ti, TiN, and the like. The shielding layer may be more rigid than the dielectric layer such that, in the fabricating process of the image sensor structure, the top surface of the dielectric layer is in a dishing shape after performing a CMP process having selectivity between the shielding layer and the dielectric layer. The removal of the peripheral portion of the dielectric layer in the sensing region is relatively little due to the support by the shielding layer. The removal of the central portion of the dielectric layer in the sensing region is easy and deeper due to the significant dishing effect for the CMP process, since it is the center of a large dielectric layer. The shielding layer may comprise at least a ring structure. When the shielding layer comprises a plurality of layers of ring structure, the distribution density of the shielding layer may gradually decrease (or in gradient) from the outer to the inner portion of the shielding layer. Alternatively, the shielding layer may comprise a plurality of discontinuous segments, and the distribution density may also gradually decrease (or in gradient) from the outer to the inner.

Furthermore, the image sensor structure may further comprise a top layer 66 disposed on and enveloping the filters. The top layer may include the same material as the under layer and allow a planar face to be formed above the filter array.

Figure 5:
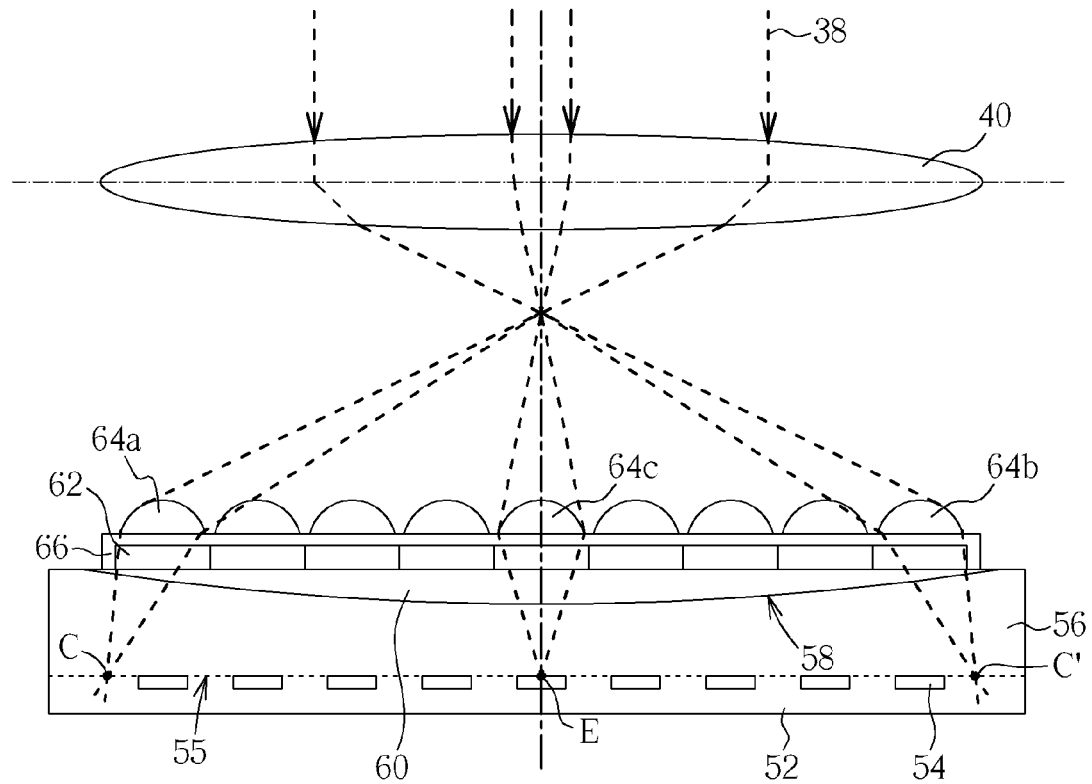
FIG. 5 illustrates a combination of the image sensor structure according to the present invention and a lens module.

FIG. 5 illustrates a combination of the image sensor structure according to the present invention and a lens module. As shown in FIG. 5, after the incident light 38 passes through the lens module 40, a light beam reaches the edge, passes through the microlens 64a or 64b at the edge, and passes through the top layer 66, the filter 62, the under layer 60, and the dielectric layer 56 to focus on the point C or C'; and another light beam reaches the center, passes through the microlens 64c at the center, and passes through the top layer 66, the filter 62, the under layer 60, and the dielectric layer 56 to focus on the point E. It can be found that the points E and C or C' are along the horizontal surface 55 of the substrate 52 where the sensor array 54 are located. As a result, with respect to photodiode as a sensing element, under irradiation of a same light amount, substantially same extent of photoelectric conversion can be obtained even for the photodiodes located at different positions. Accordingly, the central image and the peripheral image exhibit uniform brightness.

Figure 6:
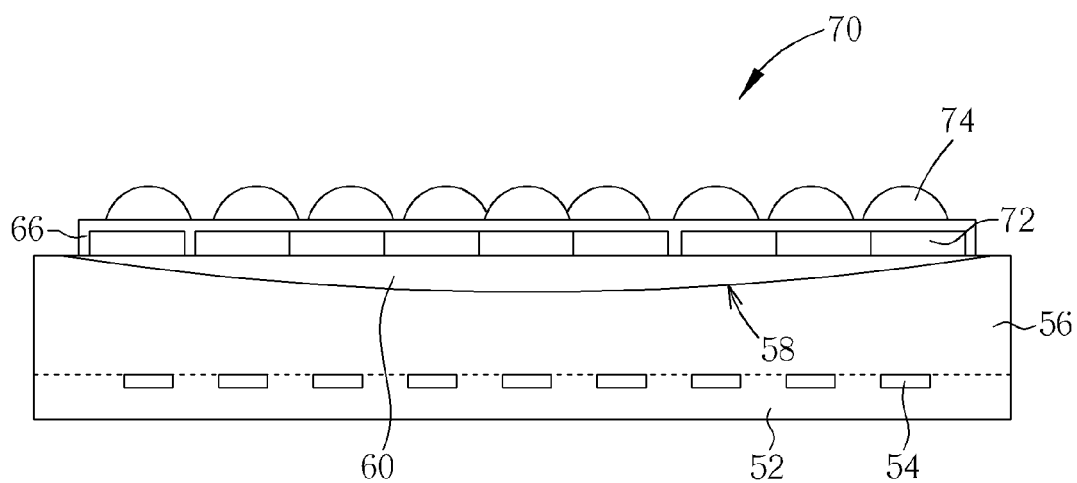
FIG. 6 illustrates a cross-sectional diagram of another embodiment of the image sensor structure according to the present invention.

In the present invention, in addition to fill the under layer material into the dishing structure to alter the optical refraction path, conventional methods for adjusting focal length maybe further adopted. For example, as shown in FIG. 6, in an image sensor structure 70, a portion of the filters 72 are shifted outward, or a portion of the microlenses 74 are shifted inward. That is, the edge portion of the filter array and the central portion of the filter array have different pitches for arrangement, or the edge portion of the microlens array and the central portion of the microlens array have different pitches for arrangement. In addition, it may make the microlens positioned in the edge portion of the microlens array to have a shape different from the microlens positioned in the central portion of the microlens array. These methods also have a function for further adjusting focal length and enhancing the focus to be located on the sensing element.

Figure 7:
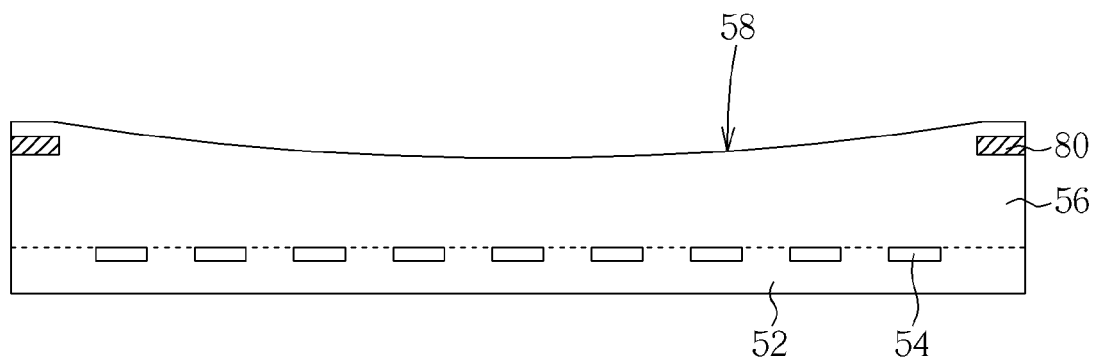
FIGS. 7-10 illustrate the method of fabricating an image sensor structure according to the present invention.

The image sensor structure according to the present invention maybe obtained from the method as described below. As shown in FIG. 7, first, a substrate 52 is provided. A sensor array 54 is formed at the surface of the substrate 52. Thereafter, a dielectric layer 56 is formed to cover the sensor array 54 and the substrate 52. For example, the dielectric layer 56 may be formed by a chemical vapor deposition process. A plurality of metal layers may be further formed in the dielectric layer 56 and maybe formed by, for example, a metal interconnect process. A passivation layer comprising silicon nitride, silicon oxide, or the like may be formed by deposition to cover the metal layers.

Figure 8:
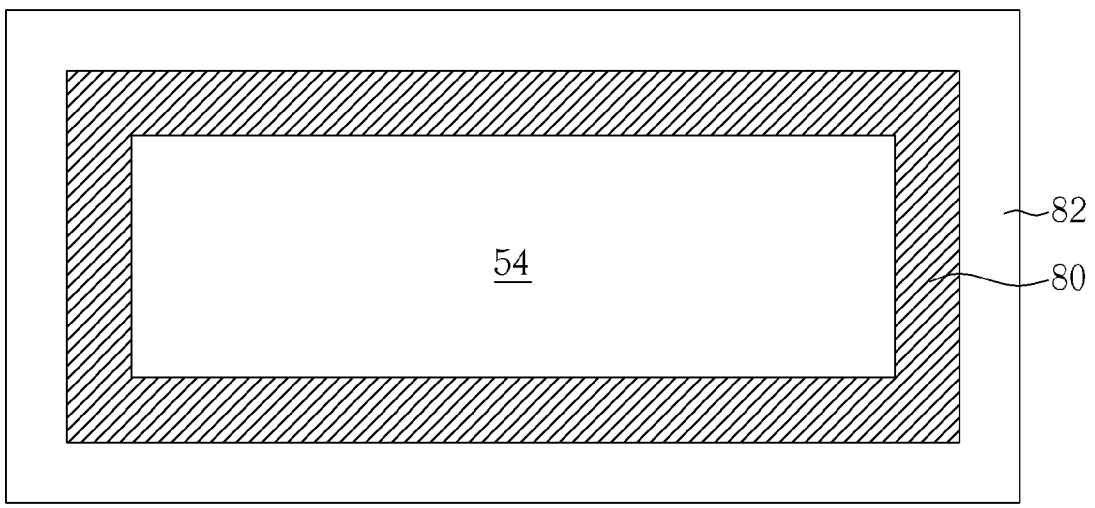

Thereafter, the top surface 58 of the dielectric layer 56 is formed into a dishing structure, which maybe achieved by performing a CMP process to polishing the dielectric layer 56. For example, if the dielectric layer is an oxide, an oxide CMP process is employed. The formulation and the conditions for the CMP process may be optimally adjusted as desired. For example, the polishing time period can be increased when it is wanted to increase the dishing extent. A shielding layer 80 may be additionally formed in the dielectric layer 56 surrounding the dishing structure. The shielding layer may reinforce the peripheral portion of the dielectric layer and retard the polishing rate in the CMP process. FIG. 8 shows a plan view illustrating that the shielding layer 80 surrounds the sensor array 54. The outmost portion 82 is a scribing line for cutting the completed image sensor structure into a separated chip. Additionally, a polishing stop layer may be further formed on the dielectric layer 56 surrounding the dishing structure before the CMP process. The polishing stop layer may prevent the portion of the dielectric layer above the shielding layer 80 from being removed to expose the shielding layer 80. If the shielding layer 80 is a metal and exposed, it easily pollutes the elements or devices.

Furthermore, forming the top surface of the dielectric layer into the dishing structure may be carried out by the combination of a CMP process and an etching process. In detailed, after the top surface 58 of the dielectric layer 56 is formed into a dishing shape using a CMP process, the dishing-shaped surface of the dielectric layer 56 may be etched using an etching process. Since the etching rate and the etching time are easily controlled, the depth of the dishing structure thus formed may be controlled conveniently and precisely.

Figure 9:
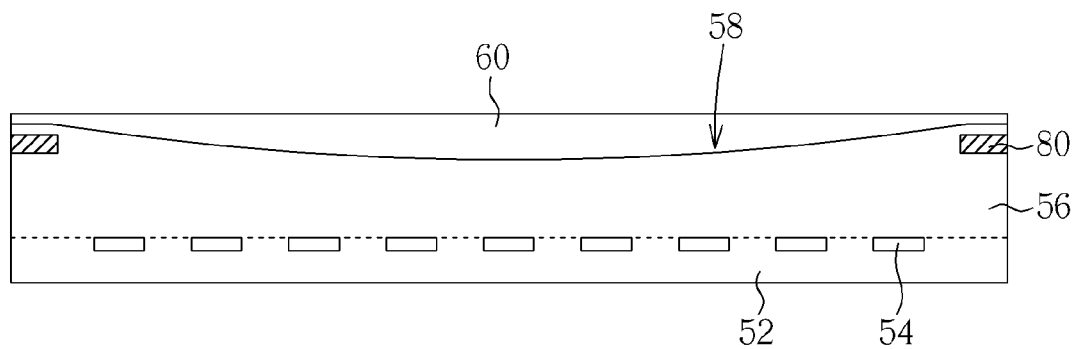

As shown in FIG. 9, after the dishing structure is formed, it is filled with an under layer material to form the under layer 60. For example, a polymer material using PGMEA (propyleneglycol methyletheracetate) and EEP (ethyl 3-ethoxypropionate) as solvent is spin-coated in the dishing structure and dried to form the under layer 60, which has a light transmittance of about 95%. It is not limited to fill up the dishing structure with the under layer material and the filling level may depend on requirement or desire. In the embodiment shown in FIG. 9, the under layer 60 is filled up and over the dishing structure to cover the original surface of the dielectric layer 56.

Figure 10:
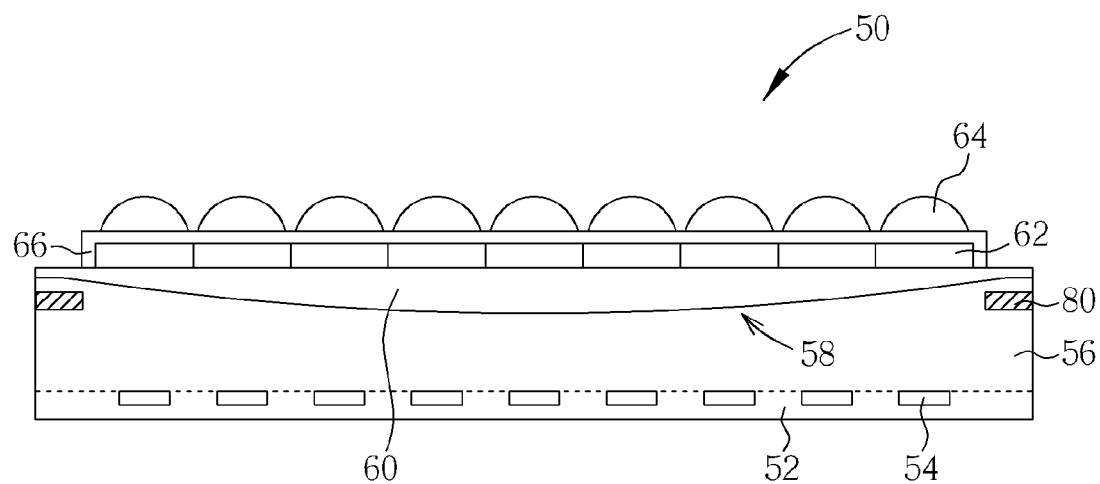

Thereafter, as shown in FIG. 10, a filter array 62 is formed on the under layer 60. A top layer 66 may be further formed on the filter array 62. The material for the top layer 66 may be the same as the under layer material. It may be also formed using a coating method. Thereafter, a microlens array 64 is formed on the filter array 62. Each filter is corresponding to a microlens and a sensing element.

In comparison with conventional techniques, the method of the present invention is characterized in that a CMP process is performed on the dielectric layer to form a dishing structure and an under layer material is filled into the dishing structure to form an under layer. The under layer may advantageously have all of the functions of focal length adjustment, planarization, and filter adhesion. The under layer material may be selected from conventional materials used to make the under layer or the top layer for the filters (but not limited thereto). Furthermore, as planarization process is also required to form the dielectric layer in the conventional technique, the desired dishing structure can be also obtained by utilizing such CMP planarization in the present invention. Hence, it is convenient and will not increase complicated steps or costly material to the novel fabrication process.

Figure 11:
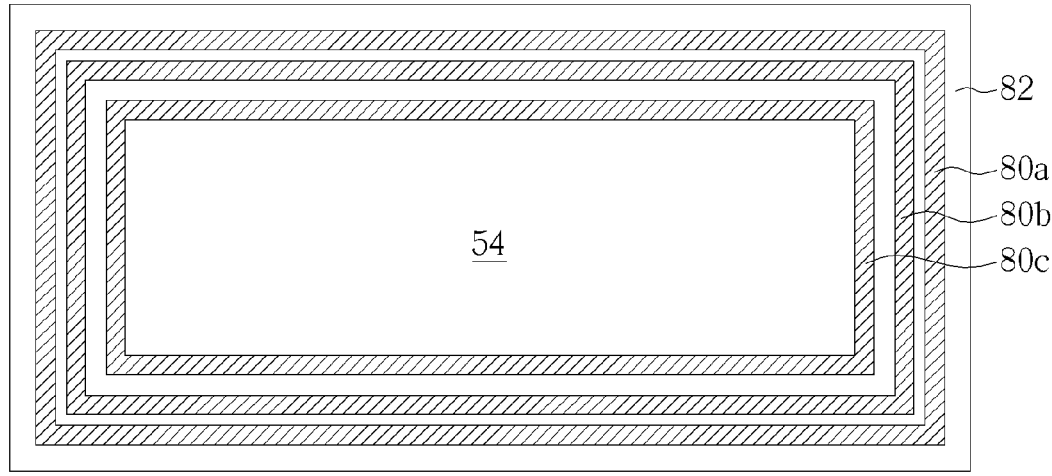
FIGS. 11-15 illustrate some embodiments of the image sensor structure according to the present invention.
Figure 12:
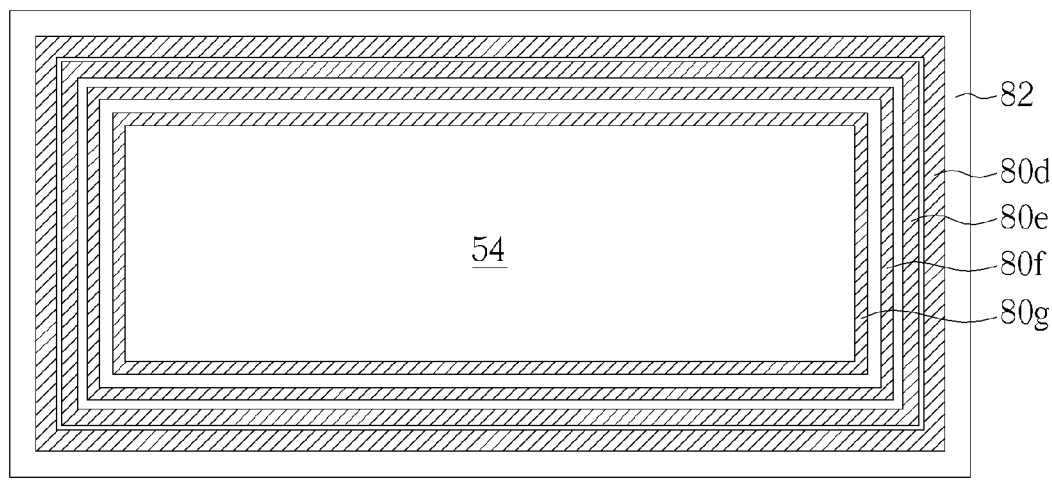
Figure 13:
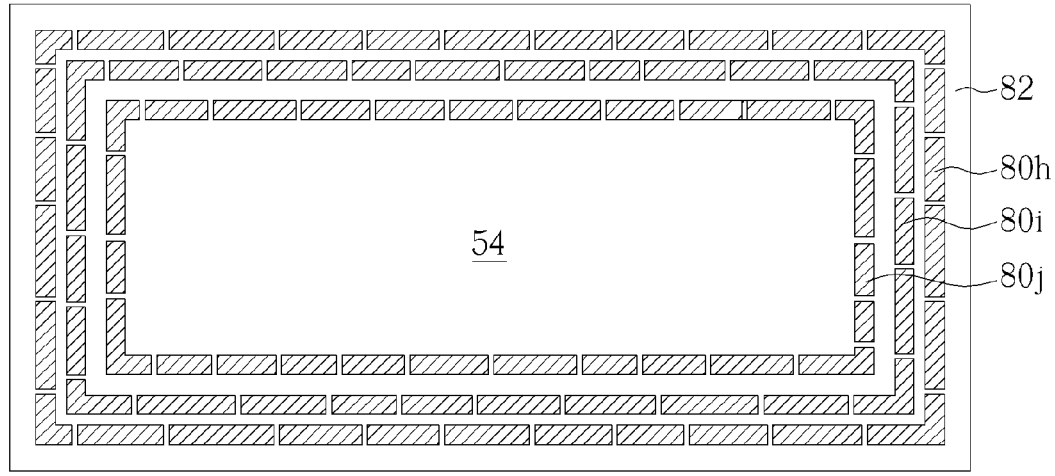
Figure 14:
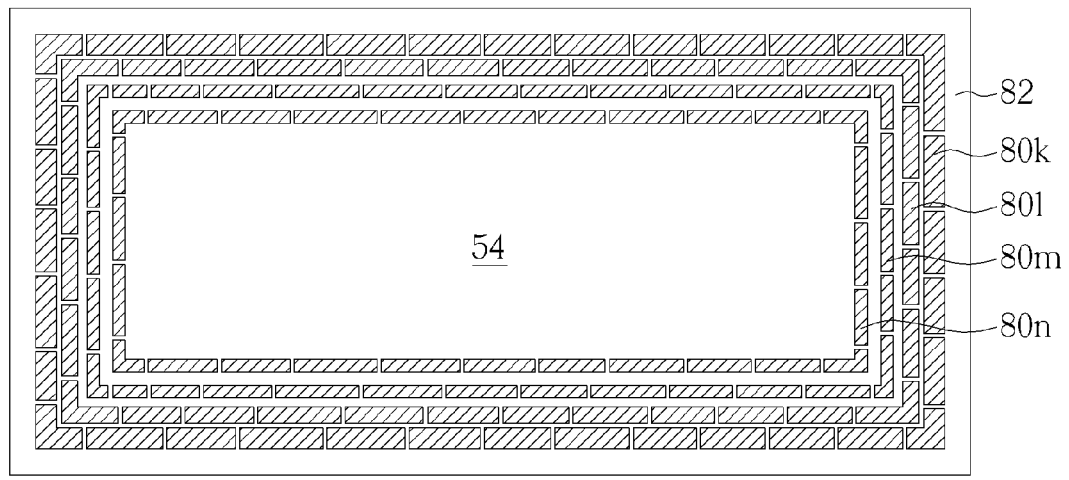
Figure 15:
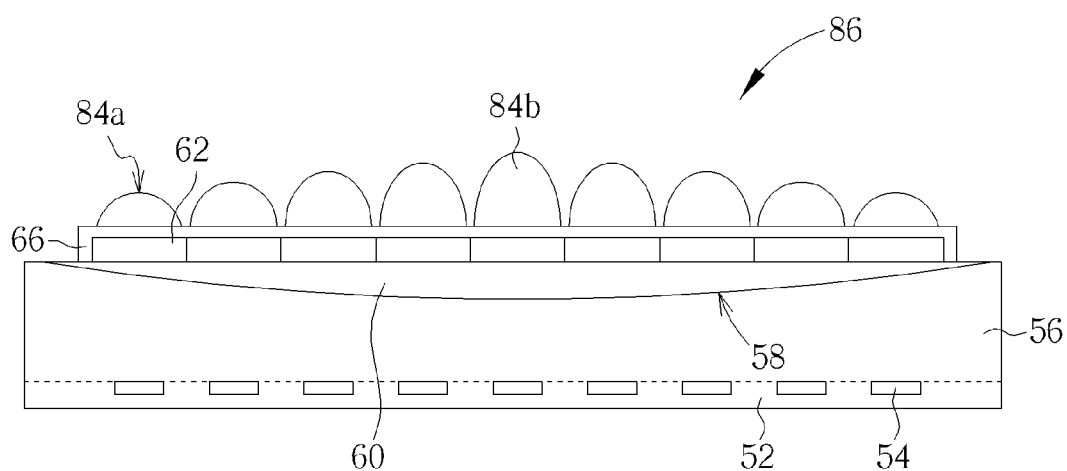

FIGS. 11-14 are plan views each showing that the shielding layer surrounds the sensor array for illustrating some embodiments of the image sensor structure according to the present invention. As shown in FIG. 11, the shielding layer includes a plurality of layers 80a, 80b and 80c of ring structure, and the distribution density of the shielding layer gradually decreases from the outer portion (the layer 80a) of the ring structure to the inner portion (the layer 80c) of the ring structure. As shown in FIG. 12, the shielding layer includes a plurality of layers 80d, 80e, 80f and 80g of ring structure, and the distribution density of the shielding layer gradually decreases from the outer portion (the layer 80d) of the ring structure to the inner portion (the layer 80g) of the ring structure. As shown in FIGS. 13 and 14, the shielding layers 80h, 80i, 80j, 80k, 80l, 80m and 80n each include a plurality of segments. FIG. 15 is a cross-sectional diagram of an embodiment of the image sensor structure 86 according to the present invention, illustrating that the microlens 84a positioned in the edge portion of the microlens array is in a shape different from the microlens 84b positioned in the central portion of the microlens array.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating an image sensor structure, comprising:
    providing a substrate;
    forming a sensor array at the surface of the substrate;
    forming a dielectric layer covering the sensor array;
    forming the top surface of the dielectric layer into a dishing structure;
    forming an under layer in the dishing structure, wherein the under layer has a refraction index greater than that of the dielectric layer;
    forming a filter array on the under layer corresponding to the sensor array; and
    forming a microlens array on the filter array.

2. The method of claim 1, further forming a shielding layer in the dielectric layer surrounding the dishing structure.

3. The method of claim 1, wherein, forming the top surface of the dielectric layer into the dishing structure is carried out through planarizing the dielectric layer using a chemical mechanical planarization process.

4. The method of claim 3, before the chemical mechanical planarization process, further comprising:
    forming a polishing stop layer on the dielectric layer surrounding the dishing structure.

5. The method of claim 1, wherein, forming the top surface of the dielectric layer into the dishing structure is carried out by steps of:
    planarizing the dielectric layer to form a dishing shape using a chemical mechanical planarization process; and performing an etch process on the dielectric layer for controlling the depth of the dishing shape to form the dishing structure.

6. The method of claim 1, further forming a top layer on the filter array to envelop the filters, wherein the top layer comprises a material the same as the under layer.

7. The method of claim 1, wherein the sensor array is a photosensor array and the photosensor array is corresponding to the filter array.

8. The method of claim 1, wherein the refraction index of the under layer is from 1.5 to 1.6.

9. The method of claim 1, wherein the refraction index of the under layer is less than that of the microlenses.

10. The method of claim 1, wherein the under layer is a glue layer and has a flat top surface.

11. The method of claim 2, wherein the shielding layer comprises a metal material.

12. The method of claim 2, wherein the shielding layer comprises at least a ring structure.

13. The method of claim 12, wherein the shielding layer comprises a plurality of layers of ring structure, and the distribution density of the shielding layer gradually decreases from the outer portion of the ring structure to the inner portion of the ring structure.

14. The method of claim 2, wherein the shielding layer comprises a plurality of segments.

15. The method of claim 14, wherein the distribution density of the shielding layer gradually decreases from the outer to the inner.

16. The method of claim 1, wherein the microlens positioned in the edge portion of the microlens array is in a shape different from the microlens positioned in the central portion of the microlens array.

17. The method of claim 1, wherein the edge portion of the filter array and the central portion of the filter array have different pitches.

18. The method of claim 1, wherein the edge portion of the microlens array and the central portion of the microlens array have different pitches.

* * * * *